(12) United States Patent
Haufe et al.

(10) Patent No.: US 10,068,918 B2
(45) Date of Patent: Sep. 4, 2018

(54) CONTACTING SOI SUBSRATES

(71) Applicant: GLOBALFOUNDRIES Inc., Grand Cayman (KY)

(72) Inventors: Christian Haufe, Dresden (DE); Ingolf Lorenz, Ottendorf-Okrilla (DE); Michael Zier, Dresden (DE); Ulrich Gerhard Hensel, Radeberg (DE); Navneet Jain, Milpitas, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/375,890

(22) Filed: Dec. 12, 2016

(65) Prior Publication Data
US 2017/0104005 A1    Apr. 13, 2017

Related U.S. Application Data

(63) Continuation-in-part of application No. 14/968,133, filed on Dec. 14, 2015.

(60) Provisional application No. 62/221,199, filed on Sep. 21, 2015.

(51) Int. Cl.
| | |
|---|---|
| *H01L 27/12* | (2006.01) |
| *H01L 29/49* | (2006.01) |
| *H01L 21/84* | (2006.01) |
| *H01L 29/06* | (2006.01) |

(52) U.S. Cl.
CPC .......... *H01L 27/1203* (2013.01); *H01L 21/84* (2013.01); *H01L 29/0696* (2013.01); *H01L 29/4916* (2013.01)

(58) Field of Classification Search
None
See application file for complete search history.

(56) References Cited

U.S. PATENT DOCUMENTS

| | | |
|---|---|---|
| 5,936,698 A | 8/1999 | Koyama |
| 6,766,496 B2 | 7/2004 | McManus et al. |
| 6,839,882 B2 | 1/2005 | McManus et al. |
| 7,808,051 B2 | 10/2010 | Hou et al. |
| 8,026,738 B2 | 9/2011 | Hillman et al. |
| 8,183,600 B2 | 5/2012 | Shimizu |
| 8,273,617 B2 | 9/2012 | Thompson et al. |
| 8,443,306 B1 | 5/2013 | Dhong et al. |
| 8,482,070 B1 | 7/2013 | Flatresse et al. |
| 8,525,245 B2 | 9/2013 | Erickson et al. |
| 8,541,824 B2 | 9/2013 | Thompson et al. |
| 8,551,823 B2 | 10/2013 | Gonzalez |
| 8,604,527 B2 | 12/2013 | Thompson et al. |
| 8,604,530 B2 | 12/2013 | Thompson et al. |
| 8,709,890 B2 | 4/2014 | Cheng et al. |

(Continued)

*Primary Examiner* — David E Graybill
(74) *Attorney, Agent, or Firm* — Amerson Law Firm, PLLC (57) ABSTRACT

An integrated circuit is provided including a semiconductor bulk substrate, a buried oxide layer formed on the semiconductor bulk substrate, a plurality of cells, each cell having a transistor device, formed over the buried oxide layer, a plurality of gate electrode lines running through the cells and providing gate electrodes for the transistor devices of the cells, and a plurality of tap cells configured for electrically contacting the semiconductor bulk substrate and arranged at positions different from positions below or above the plurality of cells having the transistor devices.

19 Claims, 5 Drawing Sheets

(56) References Cited

U.S. PATENT DOCUMENTS

| | | |
|---|---|---|
| 8,975,128 B2 | 3/2015 | Thompson et al. |
| 9,087,906 B2 | 7/2015 | Verma et al. |
| 9,092,590 B2 | 7/2015 | Giraud et al. |
| 9,111,801 B2 | 8/2015 | Zhang |
| 9,768,119 B2 * | 9/2017 | Yu ........................ H01L 23/5286 |
| 2002/0036934 A1 | 3/2002 | Hasegawa et al. |
| 2003/0023935 A1 | 1/2003 | McManus et al. |
| 2003/0023936 A1 | 1/2003 | McManus et al. |
| 2003/0023937 A1 | 1/2003 | McManus et al. |
| 2007/0296002 A1 | 12/2007 | Liang et al. |
| 2009/0140800 A1 | 6/2009 | Hillman et al. |
| 2010/0078725 A1 | 4/2010 | Hou et al. |
| 2010/0148219 A1 | 6/2010 | Shimizu |
| 2011/0074498 A1 | 3/2011 | Thompson et al. |
| 2011/0175152 A1 | 7/2011 | Booth, Jr. et al. |
| 2012/0107967 A1 | 5/2012 | Or-Bach et al. |
| 2012/0267697 A1 | 10/2012 | Erickson et al. |
| 2012/0286331 A1 | 11/2012 | Aton et al. |
| 2012/0299111 A1 | 11/2012 | Thompson et al. |
| 2013/0020638 A1 | 1/2013 | Thompson et al. |
| 2013/0020639 A1 | 1/2013 | Thompson et al. |
| 2013/0146953 A1 | 6/2013 | Cheng et al. |
| 2013/0267046 A1 | 10/2013 | Or-Bach et al. |
| 2014/0077312 A1 | 3/2014 | Thompson et al. |
| 2014/0173544 A1 | 6/2014 | Giraud et al. |
| 2014/0183602 A1 | 7/2014 | Gurumurthy |
| 2014/0264924 A1 * | 9/2014 | Yu ........................ H01L 23/5286 257/774 |
| 2015/0097240 A1 | 4/2015 | Verma et al. |
| 2015/0255350 A1 | 9/2015 | Thompson et al. |
| 2015/0325597 A1 | 11/2015 | Zhang |
| 2016/0197082 A1 | 7/2016 | Park et al. |
| 2017/0133321 A9 * | 5/2017 | Yu ........................ H01L 23/5286 |

\* cited by examiner

CONTACTING SOI SUBSRATES

BACKGROUND OF THE INVENTION

1. Field of the Invention

Generally, the present disclosure relates to the field of integrated circuits and semiconductor devices and, more particularly, to the formation of contacts to semiconductor bulk substrates of SOI devices.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

Nowadays, FETs are usually built on silicon-on-insulator (SOI) substrates and in particular Fully Depleted silicon-on-insulator (FDSOI) substrates. The channels of the FETs are formed in thin semiconductor layers, typically including or made of silicon material or other semiconductor materials, wherein the semiconductor layers are formed on insulating layers, buried oxide (BOX) layers, that are formed on semiconductor bulk substrates. One severe problem caused by the aggressive downscaling of the semiconductor devices must be seen in the occurrence of leakage currents. Since leakage currents depend on the threshold voltages of the FETs, substrate biasing (back biasing) can reduce leakage power. With this advanced technique, the substrate or the appropriate well is biased to raise the transistor thresholds, thereby reducing leakage currents. In PMOS devices, the body of the transistor is biased to a voltage higher than the positive supply voltage $V_{DD}$. In NMOS devices, the body of the transistor is biased to a voltage lower than the negative supply voltage $V_{SS}$.

Figure 1A:
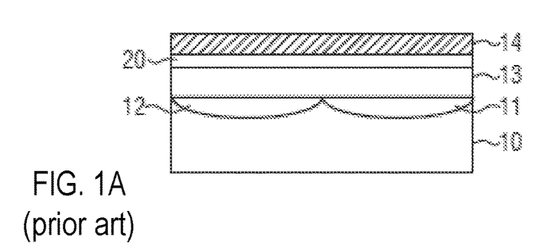
FIG. 1a shows an SOI configuration comprising doped regions in a semiconductor bulk substrate used for back biasing.
Figure 1B:
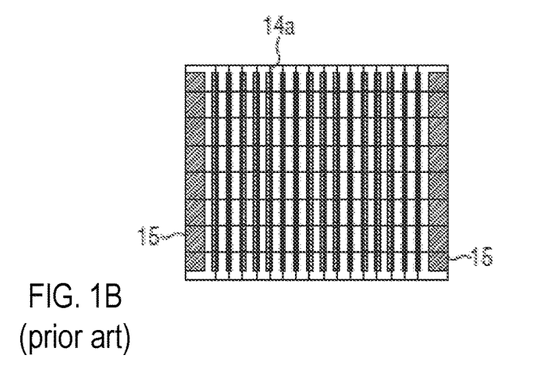
FIG. 1b shows a regular standard cell grid comprising parallel poly lines and boundary cells.

FIG. 1a shows an SOI configuration with a semiconductor bulk substrate 10 wherein an N+ doped region 11 and a P+ doped region 12 are formed in the bulk substrate 10. Further, the SOI configuration comprises a BOX layer 13 formed on the semiconductor bulk substrate 10 and a semiconductor layer 20 formed on the BOX layer 13 and providing a channel region. FIG. 1a also depicts a layer of gate electrode material 14, e.g., polysilicon formed above semiconductor layer 20. The N+ doped region 11 and the P+ doped region 12 are used for back biasing of P-channel FET gates or N-channel FET gates, respectively. In integrated circuits (IC), cell structures are formed by gate electrode lines (poly lines) 14a defining standard cells of active semiconductor devices as the one shown on FIG. 1a. In general, the polysilicon (poly) lines 14a (FIGS. 1b and 1e) run parallel to each other. It is noted that the gates of the FETs may comprise a metal material in addition to the poly material. In advanced ICs, the gate constructs are so small that, with current technologies, they cannot be manufactured as arbitrarily placed gates. Instead, a regular grid of poly lines 14a has to be manufactured consisting of parallel poly line shapes 14a with exactly defined width and spacing, as shown in FIG. 1b. Afterwards, in additional manufacturing steps, unwanted poly lines 14a will be removed using a poly line (PC) cut mask. The regular poly line grid ("sea of gates") is required to be surrounded by boundary cells that contain parallel poly line shapes 15 of larger widths in order to protect the regular poly lines 14a of the standard cells against polishing defects during manufacturing.

In order to reduce the time required to perform the design process, cell libraries have been created wherein standard cell designs are available. Of course, there are applications that may require one or more specialized cells, in which case the designer will either create a custom cell for the layout or alter a library cell in a manner required by the desired design. The resulting layout is used to manufacture the desired integrated circuit. Depending on the used design and library, back biasing can be done for the PMOS or NMOS devices or both. To bias the bulk of the NMOS and PMOS of the standard cells, voltages are created by charge pumps, which are custom blocks that output $V_{DDbias}$ and $V_{SSbias}$ voltages. Each standard cell row must have at least one (body- or well-) tap cell. However, designers sometimes have a rule of one tap cell placed in a standard cell row per every certain distance at regular intervals.

Similar to the grid of standard cells, a grid of tap cells is commonly used in integrated circuit design to provide for the body bias of the transistors. The tap cells have to create electrical connections between a network providing biasing voltages and the P+/N+ regions as regions 11 and 12 shown in FIG. 1a. Since the biasing voltage network is implemented on metal layers that are routed several layers positioned above the BOX layer 13 shown in FIG. 1a and given that the P+/N+ regions 11 and 12 reside under the BOX layer 13 in the bulk substrate 10, parts of the BOX layer 13 (being a very good insulator) have to be removed in order to create contacts to the regions 11, 12. Since the BOX layer 13 is relatively thick, the openings to be etched into the BOX layer 13 have to be relatively large. Therefore, a particular problem arises in the conventional techniques, as illustrated in FIGS. 1c to 1e.

Figure 1C:
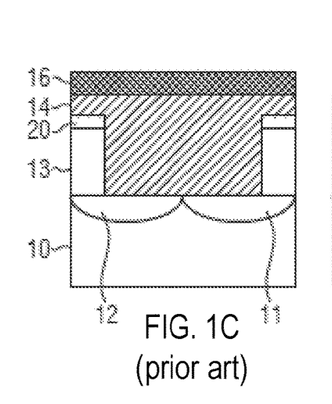
FIGS. 1c-1e illustrate a problem of wafer pollution related to thin poly ridges formed in relatively large openings formed in BOX layers.
Figure 1D:
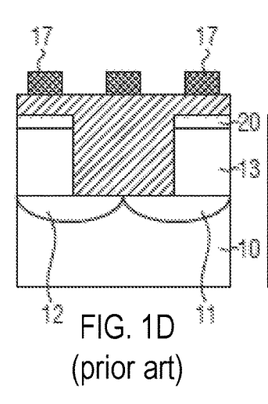
Figure 1E:
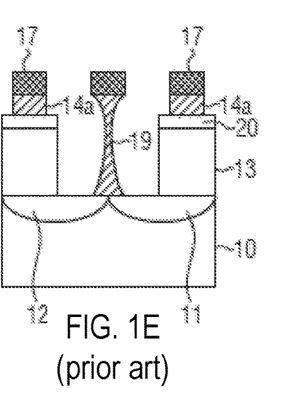

FIG. 1c shows a configuration similar to the one shown in FIG. 1a wherein after patterning of the semiconductor layer 20 an opening is formed in the BOX layer 13 that is filled with the poly material layer 14 used for the formation of gate electrodes 14a of FETs. The opening of the BOX layer 13 is formed within the area of the regular poly line grid shown in FIG. 1b. The poly material layer 14 is formed after formation of the opening is formed in the box layer 13 for the formation of a back biasing contact. A mask layer 16 is formed above the poly material layer 14 as shown in FIG. 1c. As shown in FIG. 1d, the mask layer 16 is patterned by standard lithography to obtain a patterned mask 17 used to form poly lines (gates) 14a over the BOX layer 13 (see FIG. 1e).

However, during the etching process performed for creating the poly gates 14a, a thin poly ridge 19 is formed in the opening of the BOX layer 13. In fact, the formation of the poly ridge 19 cannot be properly controlled since focus of the employed lithography device lies on the positions where the poly gates 14a have to be formed. On the other hand, formation of the poly ridge 19 cannot be avoided due to the regular poly line grid formed. The undesired formation of the poly ridge 19 in the opening of the BOX layer 13 results in a pollution of the wafer since the unstable poly ridge structure 19 easily breaks off during the further processing.

In view of the situation described above, the present disclosure provides a technique of forming substrate contacts avoiding wafer pollution due to poly debris caused by the formation of thin poly ridges in large BOX openings in manufacturing processes of the art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the formation of semiconductor devices comprising transistor devices, and, more particularly, integrated circuits with (MOS)FETs including tap cells for back biasing of the transistor devices.

An integrated circuit is provided with a semiconductor bulk substrate, a buried oxide layer formed on the semiconductor bulk substrate, a plurality of cells, each cell having a transistor device, formed over the buried oxide layer, a plurality of gate electrode lines running through the cells and providing gate electrodes for the transistor devices of the cells, and a plurality of tap cells configured for electrically contacting the semiconductor bulk substrate and arranged at positions different from positions below or above the plurality of cells having the transistor devices, wherein at least one of the plurality of tap cells is arranged between embedded boundary cells. The integrated circuit may further include a plurality of filler cells in areas that may or may not contain transistors to connect the PC lines, for example.

Furthermore, an integrated circuit is provided with a grid of standard cells, each of the standard cells having a field effect transistor built on a Fully Depleted Silicon-on-Insulator (FDSOI) substrate and a plurality of tap cells configured for providing back biasing for at least some of the field effect transistors. At least some of the tap cells are not built over or below any standard cell of the grid of standard cells.

Furthermore, a method of manufacturing an integrated circuit is provided including providing a silicon-on-insulator (SOI) substrate with a semiconductor bulk substrate and a buried oxide layer formed on the semiconductor bulk substrate, forming a transistor device on the SOI substrate, forming at least one of an N-doped region and a P-doped region in the bulk substrate, forming an opening in the buried oxide layer over the least one of the N-doped and P-doped regions and filling the opening with a contact material, and forming a plurality of gate electrode lines over the SOI substrate without filling any material of the grid into the opening. The SOI substrate may be an FDSOI substrate comprising a thin semiconductor layer formed on the buried oxide layer and providing a channel region of the transistor device. Tap cells may be formed to provide electrical connection of the N-doped and P-doped regions to a biasing voltage network providing voltages for back biasing the transistor device.

In all of the above-mentioned examples, the tap cells provide electrical connections between N-doped/P-doped regions of a semiconductor bulk substrate over which the transistor devices are formed and a biasing voltage network that is used for back biasing the transistor devices. The transistor devices may have gate electrodes that may be made of a metal material and a polysilicon material, wherein the polysilicon material is provided in the form of (poly) gate electrode lines running through a grid of regular (standard) cells.

BRIEF DESCRIPTION OF THE DRAWINGS

The disclosure may be understood by reference to the following description taken in conjunction with the accompanying drawings, in which like reference numerals identify like elements, and in which:

FIGS. 1a-1e illustrate conventional back biasing of a standard cell grid, wherein

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, for example, NMOS, PMOS, CMOS, etc., and is readily applicable to a variety of devices, including, but not limited to, logic devices, SRAM devices, etc., particularly in the context of FDSOI technologies used for manufacturing integrated circuits (ICs). Generally, manufacturing techniques and semiconductor devices in which back (substrate)-biased N-channel transistors and/or P-channel transistors may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein can be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

The present disclosure generally provides techniques for the formation of contacts to bulk substrates of FDSOI devices to facilitate back-biasing of the same and a design for tap cells and standard cells wherein poly material to be formed for the manufacturing of poly gate lines is not formed in openings of a BOX layer of an FDSOI substrate.

Exemplary tap cell—standard cell designs for ICs according to the present disclosure are illustrated in FIGS. 2a-2c, FIGS. 3a-3c, and FIG. 4. Exemplary tap cells 700N, 700P (referred to generically as tap cells 700) are illustrated in FIG. 5. The tap cells 700N, 700P include conductive contacts 705N, 705P that contact doped regions 710N ($N^+$ doped), 710P ($P^+$ doped) defined in the substrate 715, respectively. Barrier layers 720N, 720P may be formed on sidewalls of the contacts 705N, 705P. The contacts 705N, 705P extend through a dielectric layer 725, an active semiconductor layer 730, and a BOX layer 735 to contact the doped regions 710N, 710P. The construction of the tap cells 700N, 700P illustrated in FIG. 5 is provided for illustrative purposes. The tap cells 700 may have different geometries and may include multiple layers of material. The substrate 715 may be a fully depleted SOI substrate.

The substrate contacts 705N, 705P of the tap cells 700N, 700P provided for back biasing of FETs including gate electrodes 740, 740' are moved outside of the regular grid of cells 745, 745' each comprising a FET. The cells 745 may represent standard cells, and the cells 745' may represent boundary cells. The gate electrodes 740' of the boundary cells 745' are wider as compared to the gate electrodes 740 of the standard cells 745. The gate electrodes 740' may be non-functional or dummy dates. The gate electrodes 740, 740' may be at least partially polysilicon. In some embodiments, the gate electrodes 740, 740' may have multiple layers.

Figure 2A:
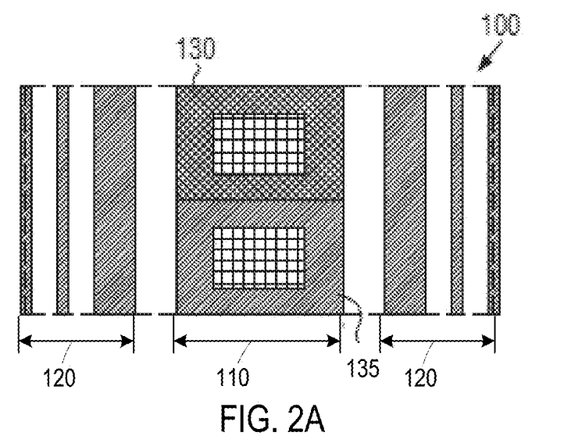
FIGS. 2a-2c illustrate tap cell—standard cell designs for ICs wherein substrate contacts are moved outside of a regular poly line grid.
Figure 2B:
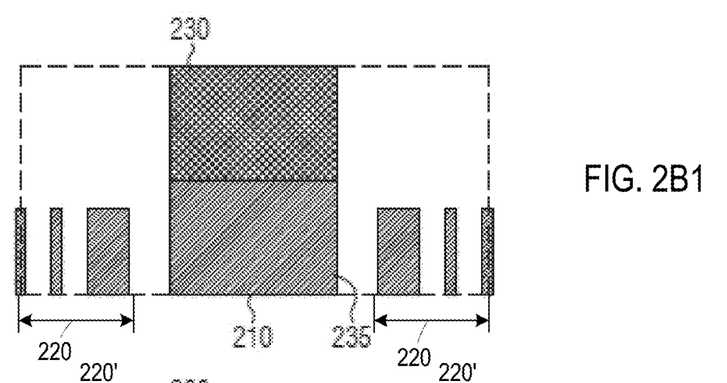
Figure 2B:
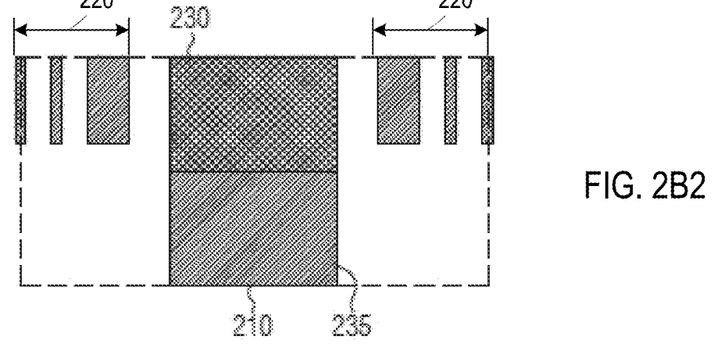

The cell outline 100 shown in FIG. 2a is characterized by a tap cell/BOX opening 110 provided in a region of a wafer where no poly material being part of a regular poly line grid or poly gate is formed. The wafer substrate may be contacted in P-doped region 130 and N-doped region 135, that might be similar to regions 11 and 12 illustrated in FIG. 1a and regions 710P, 710N in FIG. 5. The tap cell/BOX opening 110 is arranged between embedded boundary cells/poly lines 120. The embedded boundary cells 120 may be similar to boundary cells 15 of the conventional design (see FIG. 1b) but they are formed within an otherwise regular grid of standard cells rather than only at edges of that grid.

The standard cells may represent any kind of logic cells comprising FETs, for example, inverter, NAND gate cells, multiplexers and the like. As it is shown in FIG. 2b, particular bottom boundary cells 220 (top drawing of FIG. 2b) and top boundary cells 220' (bottom drawing of FIG. 2b) may be formed. The wafer substrate may be contacted in P-doped region 230 and N-doped region 235 in the region 210. As a consequence of the illustrated design, poly lines of the grid of standard cells will always be sufficiently spaced apart from openings in BOX layers (namely, outside the boundary cells 120), such that no poly debris is caused by an undesired formation of unstable poly structures in these openings as it is described above with respect to the prior art.

Figure 2C:
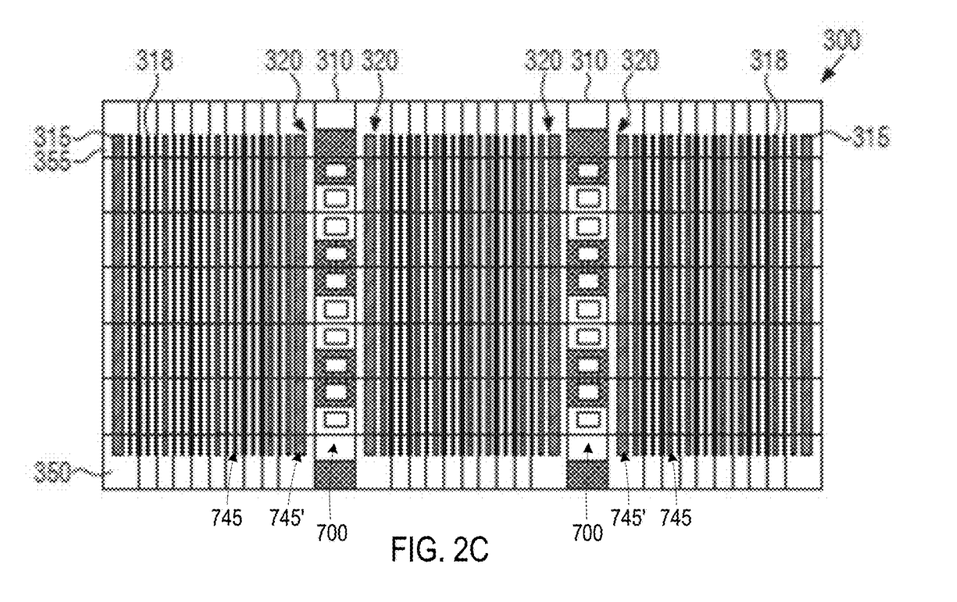

As a consequence of the wider poly shapes 320 in the embedded boundary cells 745' next to the substrate contacts, tap cells 700 are not placed above or below regular standard cells 745, since these standard cells 745 use the regular poly line grid. Rather, tap cells 700 may be placed in tap cell columns starting at the lower standard cell boundary row and ending at the upper standard cell boundary row as illustrated in FIG. 2c. In some detail, FIG. 2c shows a tap cell—standard cell design 300 for an IC with standard cells 350 at a lower boundary and standard cells 355 at an upper boundary of a specified region of a wafer. Similar to a conventional design, boundary cells and boundary poly lines 315 are provided at the left and right boundaries of the region. The boundary poly line shapes 315 have larger widths than the poly lines 318 of the standard cells in order to protect these regular poly lines 318 against polishing defects during manufacturing.

Poly lines 318 of the standard cells 745 run parallel to each other. The conventional regularity of the poly line grid is broken by the provision of columns of embedded (inner) boundary cells 745'/poly lines 320. Between two columns of embedded boundary cells 745'/poly lines 320, openings in the BOX layer 310 and tap cells 700 are arranged for contacting N-doped and P-doped regions of the semiconductor bulk substrate of the wafer. The N-doped region may be a region heavily doped with an N-type impurity, such as phosphorous, arsenic or the like. The P-doped region may be a region heavily doped with a P-type impurity, such as boron, indium or the like. "Heavily doped" may comprise any impurity concentration of above $10^{19}/cm^3$, for example. The tap cells 700 provide electrical connections between the N-doped/P-doped regions of a bulk substrate over which the transistor devices are formed and a biasing voltage network that is used for back biasing of the transistor devices.

It is noted that, in the design shown in FIG. 2c, tap cells 700 may be positioned at equally spaced intervals in columns of the IC configuration. It may be preferred that the distance between tap cells 700 does not exceed the maximum allowable distance obtained using the design rules that are associated with the IC. Specifically, the design rules may specify the maximum distance from any point in the substrate or well region to the nearest substrate or well tap, respectively. Moreover, it should be noted that, in addition to providing for coupling of doped regions of the semiconductor bulk substrate, the tap cells 700 may provide decoupling capacitors for power lines in order to use areas occupied by the tap cells 700 more efficiently.

The tap cells 700 may be arranged within an IC design layout prior to, after or concurrently with the layout of standard cells 745. Power leakage reduction and control may be optimized by the quantity and positioning of the tap cells 700. The interval spacing of the tap cells 700 may be based on the geometric dimensions of associated FETs and other devices, such that, as geometries continue to shrink, the frequency and spacing of tap cells 700 may increase or decrease as desired.

Each of the tap cells 700 may also have a bias voltage source and/or controller that is separated from the voltage source and/or controller of the associated devices. The voltage source and/or controller for the tap cells 700 may be located local or remote relative to the associated devices, possibly even on a separate die or chip. Each tap cell 700 may have separate voltage sources. Alternatively, all tap cells 700 may be controlled by a single voltage source. Clusters of tap cells 700 within an IC may each have a shared voltage, such that each cluster of tap cells 700 in an IC may be connected to a corresponding voltage source and/or controller.

Here, and in the following examples, the disclosed layouts may be integrated in an IC design tool that may include a plurality of electronic software design tools that can be coupled to various databases, such as those of a semiconductor foundry and/or one or more customers of a foundry. Particularly, the IC design tool may include a plurality of device libraries which can be accessed through a graphical user interface, whereby cells from individual device libraries may be placed within an IC design layout.

In this example, as well as in the examples described in the following with reference to FIGS. 3a, 3b and 4, the disclosed tap cell 700—standard cell 745, 745' design may be employed in the context of the manufacture of semiconductor device comprising SOI or FDSOI FETs. The FETs that can be back biased by means of the tap cells 700 may comprise FETs having configurations similar to the one shown in FIG. 1a. In some detail, a FET back biased by means of the herein disclosed design may be formed on an FDSOI substrate comprising a bulk substrate, a BOX layer formed on the bulk substrate and a semiconductor layer formed on the BOX layer.

The bulk semiconductor substrate may be a silicon substrate 715, in particular, a single crystal silicon substrate. Other materials may be used to form the semiconductor substrate such as, for example, germanium, silicon germanium, gallium phosphate, gallium arsenide, etc. The bulk semiconductor substrate 715 comprises $N^+/P^+$ doped regions 710N, 710P for back biasing. The BOX layer 735 may include a dielectric material, such as silicon dioxide, and may have a thickness of at least 50 nm, for example. The semiconductor layer 730 may provide the channel region of a FET and may be comprised of any appropriate semiconductor material, such as silicon, silicon/germanium, silicon/carbon, other II-VI or III-V semiconductor compounds and the like. The semiconductor layer 730 may have a thickness suitable for forming a fully depleted field effect transistor, for example, a thickness in a range from about 5-8 nm.

The FET comprises a gate electrode formed over the semiconductor layer. The gate electrode may comprise metal gate and polysilicon gate materials. The material of the metal gate may depend on whether the transistor device to be formed is a P-channel transistor or an N-channel transistor. In embodiments wherein the transistor device is an N-channel transistor, the metal may include La, LaN or TiN. In embodiments wherein the transistor device is a P-channel transistor, the metal may include Al, AN or TiN.

The metal gate may include a work function adjusting material, for example, TiN. In particular, the metal gate may comprise a work function adjusting material that comprises an appropriate transition metal nitride, for example, those from Groups IV-VI in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm. Moreover, the effective work function of the metal gate may be adjusted by added impurities, for example, Al, C or F. Atop of the metal gate, the poly gate may be formed.

The gate electrode may be separated from the semiconductor layer of the FDSOI substrate by a gate dielectric. The gate dielectric may comprise a high-k material layer with a dielectric constant k of above 4. The high-k material layer may comprise a transitional metal oxide, such as at least one of hafnium oxide, hafnium dioxide and hafnium silicon-oxynitride, and may be directly formed on the semiconductor layer of the FDSOI substrate.

Figure 3A:
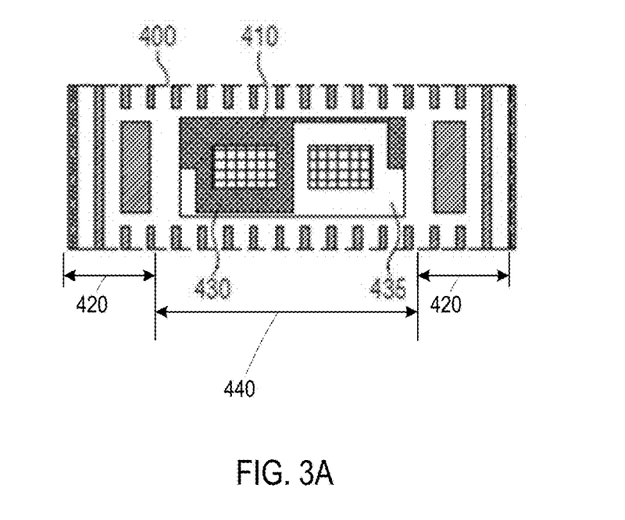
FIGS. 3a-3b illustrate alternative tap cell—standard cell designs for ICs wherein substrate contacts are moved outside of a regular poly line grid.
Figure 3B:
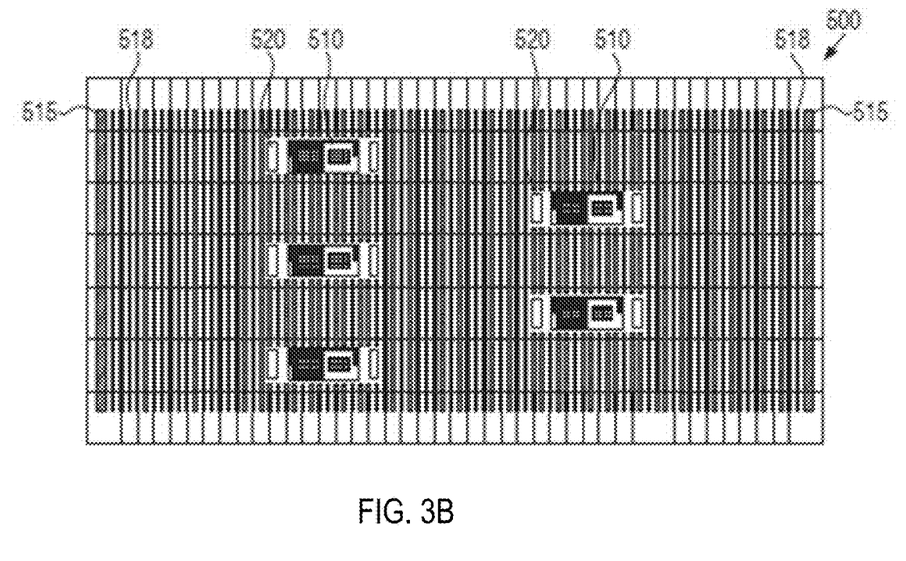

Other exemplary tap cell 700—standard cell 745 designs for ICs according to the present disclosure are shown in FIGS. 3a and 3b. The designs 400 and 500 integrate elements of the boundary cells 745' from top and bottom comparable to the design shown in FIGS. 2a-2c, but with an increased cell width, as can be learned from FIGS. 3a and 3b.

The tap cells 700 of the layouts 400 and 500 consume more area per cell as compared to the ones shown in FIGS. 2a-2c, but they can be placed arbitrarily inside the layout. Therefore, placement of the tap cells 700 can be achieved in a more flexible manner and less tap cells 700 may be needed when placed in checker-board design. Also, no special boundary cells are required for adjustment to the tap cell poly line grid at the placement boundaries.

As shown in FIG. 3a, the layout 400 comprises embedded boundary cells 420 and a top/bottom cells structure 440. An opening 410 in the BOX layer is arranged between the structures 420 and 440. The opening 410 allows for electrically contacting P-doped region 430 and N-doped region 435 formed in the bulk semiconductor substrate for back biasing a transistor device formed above the semiconductor layer and the semiconductor bulk substrate. Such a tap cell layout 400 can be used in a tap cell—standard cell layout 500 illustrated in FIG. 3*b*.

Similar to the layout shown in FIG. 2*c*, the one shown in FIG. 3*b* comprises columns of boundary cells/poly lines 515 and parallel arranged poly lines 518. Moreover, embedded boundary cells/poly lines 520 are provided, between which openings 510 in the BOX layer and, thus, tap cells can be arranged.

Figure 4:
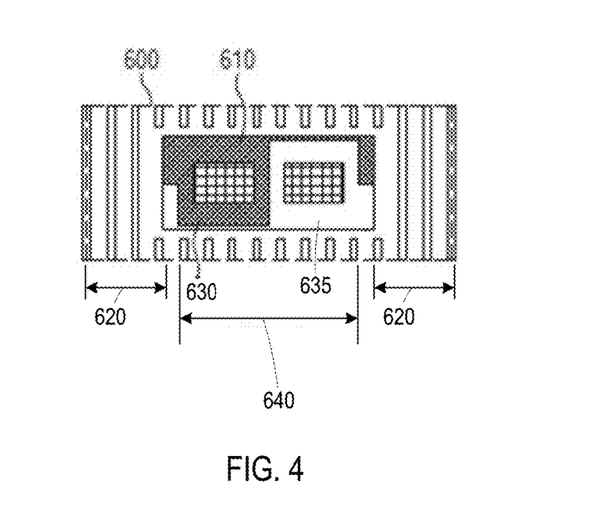
FIG. 4 illustrates another alternative tap cell—standard cell design for ICs wherein substrate contacts are moved outside of a regular poly line grid.
Figure 5:
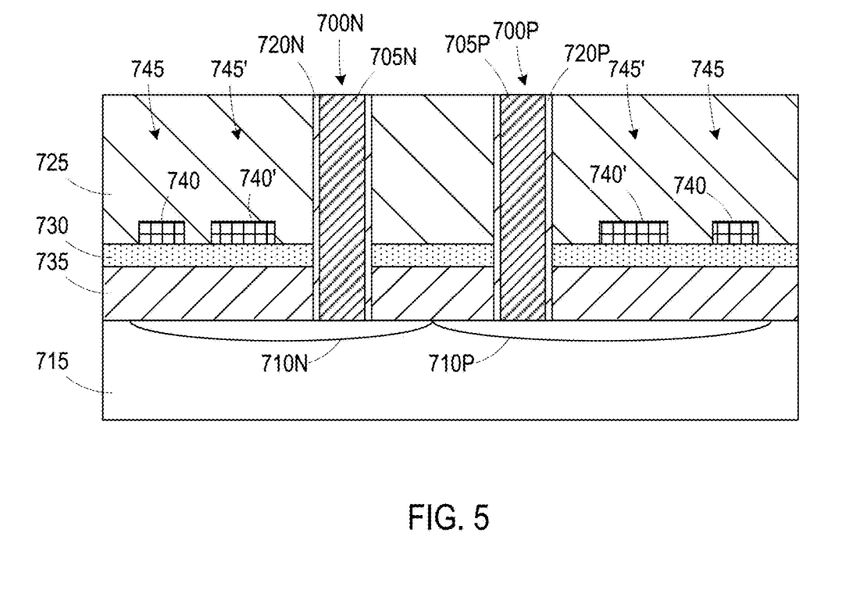
FIG. 5 is a cross section diagram of a tap cell in accordance with some embodiments.

According to another example shown in FIG. 4, the need for a relatively broad embedded poly lines as shown in FIGS. 3*a* and 3*b* can be avoided by suitably chosen post-design compensation (re-targeting) and corresponding design rules. Thereby, the space needed to implement the tap cell suitable for an arbitrary placement can be reduced. The layout 600 shown in FIG. 4 comprises embedded boundary cells/poly lines 620 and an embedded top/bottom cell structure 640 with an opening 610 formed in the BOX layer for contacting P-doped 630 and N-doped 635 regions as described above.

As a result, the present disclosure provides tap cell—standard cell layouts that avoid the formation of poly material in openings formed in BOX layers of FDSOI substrates for contacting doped regions of the bulk substrates of the FDSOI substrates needed for back biasing of FETs. Thereby, contamination of wafers due to poly debris resulting from unstable poly structures formed in the openings of BOX layers can be avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit, comprising:
   a semiconductor bulk substrate;
   a buried oxide layer formed on said semiconductor bulk substrate;
   a plurality of cells, each cell having a transistor device, formed over said buried oxide layer, said plurality of cells including arrays of standard cells, each array being bounded by boundary cells;
   a plurality of gate electrode lines running through said plurality of cells and providing first gate electrodes for said transistor devices of said cells; and
   a plurality of tap cells each having a contact connected to said semiconductor bulk substrate, wherein at least one of said plurality of tap cells is arranged immediately adjacent and between inner boundary cells including second gate electrodes.

2. The integrated circuit of claim 1, wherein said semiconductor bulk substrate comprises at least one of an N-doped or a P-doped region associated with one of said plurality of tap cells and electrically connected to a bias voltage source by the one of said plurality of tap cells via a contact formed in an opening in said buried oxide layer.

3. The integrated circuit of claim 1, wherein said second gate electrodes in said inner boundary cells have larger widths than said first gate electrodes.

4. The integrated circuit of claim 1, wherein said second gate electrodes have substantially the same widths as said first gate electrodes.

5. The integrated circuit of claim 1, wherein said plurality of tap cells is arranged in at least one column parallel to columns of said plurality of cells having said transistor devices such that said tap cells are positioned adjacent to each other in said at least one column.

6. The integrated circuit of claim 1, further comprising outer boundary cells arranged adjacent to outermost ones of said plurality of cells and having third gate electrodes with widths larger than the widths of said first gate electrodes.

7. The integrated circuit of claim 1, wherein said buried oxide layer and said semiconductor bulk substrate are part of a Fully Depleted Silicon-on-Insulator (FDSOI) substrate.

8. The integrated circuit of claim 1, wherein said gate electrode lines are at least partially made of a polysilicon material.

9. An integrated circuit, comprising:
   a grid of standard cells, each of said standard cells having a field effect transistor with a first gate electrode built on a Fully Depleted Silicon-on-Insulator (FDSOI) substrate;
   a plurality of tap cells configured for providing back biasing for at least some of said field effect transistors; and
   boundary cells having second gate electrodes and being positioned immediately adjacent first and second sides of at least one of said tap cells.

10. The integrated circuit of claim 9, wherein said FDSOI substrate has a bulk substrate with N-doped and P-doped regions and a buried oxide layer formed over said bulk substrate and wherein said tap cells include contacts formed through said buried oxide layer and reaching to said N-doped and P-doped regions thereby allowing for said back biasing of said field effect transistors.

11. The integrated circuit of claim 9, wherein said first gate electrodes comprise polysilicon lines.

12. The integrated circuit of claim 9, further comprising outer boundary cells having third gate electrodes and being arranged adjacent to outermost ones of said standard cells, wherein said second and third gate electrodes have widths larger than widths of said first gate electrodes.

13. The integrated circuit of claim 9, further comprising outer boundary cells having third gate electrodes and being arranged adjacent to outermost ones of said standard cells, wherein said third gate electrodes have substantially the same widths as said first gate electrodes.

14. The integrated circuit of claim 9, wherein said field effect transistors are formed on a gate dielectric layer formed on a semiconductor layer of said FDSOI substrate and said first gate electrodes comprise a metal material and a polysilicon material.

15. A method, comprising:
- providing a semiconductor bulk substrate with a buried oxide layer formed on said semiconductor bulk substrate;
- forming a plurality of cells, each cell having a transistor device, over said buried oxide layer, said plurality of cells including arrays of standard cells, each array being bounded by boundary cells;
- forming a plurality of gate electrode lines running through said plurality of cells and providing first gate electrodes for said transistor devices of said cells; and
- forming a plurality of tap cells, each having a contact connected to said semiconductor bulk substrate, wherein at least one of said plurality of tap cells is arranged immediately adjacent and between inner boundary cells including second gate electrodes.

16. The method of claim 15, further comprising forming at least one of an N-doped or a P-doped region in said semiconductor bulk substrate, wherein said at least one of said N-doped or said P-doped region is associated with one of said plurality of tap cells and electrically connected to a bias voltage source by the one of said plurality of tap cells via a contact formed in an opening in said buried oxide layer.

17. The method of claim 15, wherein said second gate electrodes in said inner boundary cells have larger widths than said first gate electrodes.

18. The method of claim 15, wherein said plurality of tap cells is arranged in at least one column parallel to columns of said plurality of cells having said transistor devices such that said tap cells are positioned adjacent to each other in said at least one column.

19. The method of claim 15, further comprising forming outer boundary cells arranged adjacent to outermost ones of said plurality of cells, said outer boundary cells having third gate electrodes with widths larger than the widths of said first gate electrodes.

* * * * *